(12) United States Patent
Yoshida et al.

(10) Patent No.: US 9,977,165 B2
(45) Date of Patent: May 22, 2018

(54) METHOD OF PRODUCING OPTICAL LAMINATE, OPTICAL LAMINATE, POLARIZING PLATE AND ORGANIC EL DISPLAY DEVICE

(71) Applicant: FUJIFILM Corporation, Tokyo (JP)

(72) Inventors: Shinpei Yoshida, Kanagawa (JP);
Masaaki Suzuki, Kanagawa (JP);
Kazuhiro Amemiya, Kanagawa (JP);
Taketo Otani, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days. days.

(21) Appl. No.: 15/431,237

(22) Filed: Feb. 13, 2017

(65) Prior Publication Data
US 2017/0153369 A1 Jun. 1, 2017

Related U.S. Application Data

(63) Continuation of application No. PCT/JP2015/074086, filed on Aug. 26, 2015.

(30) Foreign Application Priority Data
Aug. 29, 2014 (JP) ................................. 2014-175874

(51) Int. Cl.
*H01L 51/52* (2006.01)
*G02B 5/30* (2006.01)
(Continued)

(52) U.S. Cl.
CPC ............ *G02B 5/3016* (2013.01); *B32B 27/08* (2013.01); *B32B 27/30* (2013.01); *B32B 27/306* (2013.01);
(Continued)

(58) Field of Classification Search
None
See application file for complete search history.

(56) References Cited

U.S. PATENT DOCUMENTS

| 4,639,069 A | * | 1/1987 | Yatabe | ................... G02B 5/282 |
| | | | | 359/360 |
| 5,302,449 A | * | 4/1994 | Eby | ....................... C03C 17/366 |
| | | | | 359/359 |

(Continued)

FOREIGN PATENT DOCUMENTS

| JP | 2006-075698 A | 3/2006 |
| JP | 2006-195153 A | 7/2006 |

(Continued)

OTHER PUBLICATIONS

International Search Report issued in PCT/JP2015/074086 dated Nov. 24, 2015.

(Continued)

*Primary Examiner* — Michael Lebentritt
(74) *Attorney, Agent, or Firm* — Edwards Neils LLC; Jean C. Edwards, Esq.

(57) ABSTRACT

The present invention provides an optical laminate which is suppressed in film thickness unevenness of an optically anisotropic layer and is free from point defects, a method of producing the same, and a polarizing plate and an organic EL display device using the optical laminate. The method of producing an optical laminate having an optically anisotropic layer A and an optically anisotropic layer B, includes where the layer A and the layer B are provided in direct contact with each other. The method further includes where both a composition a for forming the layer A and a composition b for forming the layer B contain a fluorine compound, and when the layer A is formed using composition a and layer B is formed using composition b, layer A and layer B (Continued)

are formed in this order under the condition that composition a and composition b satisfy predetermined surface tension relationships.

6 Claims, 3 Drawing Sheets

(51) Int. Cl.
    *B32B 27/08*     (2006.01)
    *B32B 27/30*     (2006.01)
    *B32B 27/32*     (2006.01)
    *B32B 27/36*     (2006.01)

(52) U.S. Cl.
    CPC ............ *B32B 27/32* (2013.01); *B32B 27/365* (2013.01); *G02B 5/305* (2013.01); *G02B 5/3083* (2013.01); *H01L 51/5281* (2013.01); *B32B 2255/26* (2013.01); *B32B 2270/00* (2013.01); *B32B 2307/416* (2013.01); *B32B 2307/42* (2013.01); *B32B 2307/422* (2013.01); *B32B 2307/706* (2013.01); *B32B 2457/202* (2013.01); *B32B 2457/206* (2013.01)

(56) References Cited

U.S. PATENT DOCUMENTS

| | | | |
|---|---|---|---|
| 6,144,479 | A | 11/2000 | Lugg et al. |
| 9,341,748 | B2 * | 5/2016 | Krasnov ................. G02B 1/105 |
| 2008/0038472 | A1 * | 2/2008 | Suzuki .................... B05D 1/36 |
| | | | 427/384 |
| 2010/0079867 | A1 * | 4/2010 | Wakizaka ............... G02B 1/111 |
| | | | 359/586 |
| 2011/0026126 | A1 * | 2/2011 | Takada .................... B32B 23/08 |
| | | | 359/601 |
| 2011/0080824 | A1 * | 4/2011 | Ito ........................... B32B 27/08 |
| | | | 369/283 |
| 2014/0375935 | A1 | 12/2014 | Yamada et al. |
| 2015/0301385 | A1 * | 10/2015 | Tsunekawa ......... G02F 1/13363 |
| | | | 349/12 |
| 2016/0070030 | A1 * | 3/2016 | Fujisawa .............. C07D 231/12 |
| | | | 359/489.07 |

FOREIGN PATENT DOCUMENTS

| | | |
|---|---|---|
| JP | 2006-276817 A | 10/2006 |
| JP | 2014-038143 A | 2/2014 |
| KR | 2004-0086808 A | 10/2004 |
| WO | 2013/137464 | 9/2013 |
| WO | 2014/073616 A1 | 5/2014 |

OTHER PUBLICATIONS

International Preliminary Report on Patentability issued by WIPO dated Mar. 2, 2017, in connection with international Patent Application No. PCT/JP2015/074086.

Notification of Reasons for Refusal issued by the Japanese Patent Office dated Dec. 5, 2017, in connection with corresponding Japanese Patent Application No. 2016-545593.

Notification of Reason for Refusal issued by the Korean Intellectual Property Office dated Jan. 5, 2018, in connection with Korean Patent Application No. 10-2017-7001964.

\* cited by examiner

METHOD OF PRODUCING OPTICAL LAMINATE, OPTICAL LAMINATE, POLARIZING PLATE AND ORGANIC EL DISPLAY DEVICE

CROSS-REFERENCE TO RELATED APPLICATIONS

This application is a Continuation of PCT International Application No. PCT/JP2015/074086 filed on Aug. 26, 2015, which was published under PCT Article 21(2) in Japanese, and which claims priority under 35 U.S.C. § 119(a) to Japanese Patent Application No. 2014-175874 filed on Aug. 29, 2014. The above applications are hereby expressly incorporated by reference, in their entirety, into the present application.

BACKGROUND OF THE INVENTION

1. Field of the Invention

The present invention relates to a method of producing an optical laminate, an optical laminate, a polarizing plate, and an organic EL display device.

2. Description of the Related Art

A phase difference plate has very numerous applications and is already used for a reflective type liquid crystal display (LCD), a semi-transmissive type LCD, a brightness enhancement film, an organic electroluminescence (EL) display device, a touch panel, and the like. For example, since an organic EL display device has a structure in which layers having different refractive indexes are laminated or a structure in which metal electrodes are used, there arises a problem that external light is reflected in the interfaces of each of these layers to cause a reduction in contrast and reflected glare. Therefore, conventionally, in order to suppress an adverse effect caused by reflection of external light, a polarizing plate composed of a phase difference plate and a polarizing film is used in an organic EL display device, an LCD display device, and the like.

For example, WO2014/073616A discloses a phase difference plate including a transparent support, and a laminated optically anisotropic layer having a first optically anisotropic layer (H) which is formed of a composition containing a discotic liquid crystal compound represented by a predetermined structural formula, and a second optically anisotropic layer (Q) which is formed of a composition containing a rod-like liquid crystal compound ([claim 1]).

In addition, WO2013/137464A discloses, as an embodiment of an organic EL display device, an organic EL display device including at least a polarizer layer, a transparent support layer of one or more layers, a λ/2 plate composed of a layer containing a discotic liquid crystal compound, a λ/4 plate composed of a layer containing a discotic liquid crystal compound, and an organic EL panel in this order ([claim 7]).

SUMMARY OF THE INVENTION

When the present inventors have investigated a conventionally known optical laminate such as the laminated optically anisotropic layer disclosed in WO2014/073616A or the laminate of the λ/2 plate and the λ/4 plate disclosed in WO2013/137464A, it has been found that in an embodiment in which optically anisotropic layers are in direct contact with each other, depending on the composition of the composition (coating liquid) for forming an optically anisotropic layer, there is a case in which recesses (point defects) are generated on the surface of an optical laminate to be prepared at a frequency of about 10 pieces/100 cm², or a case in which film thickness unevenness is generated in an optically anisotropic layer constituting an optical laminate.

An object of the present invention is to provide an optical laminate which is suppressed in film thickness unevenness of an optically anisotropic layer and is free from point defects, a method of producing the same, and a polarizing plate and an organic EL display device using an optical laminate.

As a result of intensive investigations to solve the above problems, when the present inventors have paid attention to a fluorine compound included in an optically anisotropic layer or in a composition for forming an optically anisotropic layer, it has been found that the surface tension of a predetermined solution containing this fluorine compound satisfies a specific relationship between optically anisotropic layers that are in direct contact with each other to obtain an optical laminate which is suppressed in film thickness unevenness of an optically anisotropic layer and is free from point defects, thereby completing the present invention.

That is, it has been found that the above object can be achieved by adopting the following configurations.

[1] A method of producing an optical laminate having an optically anisotropic layer A, and an optically anisotropic layer B, in which the optically anisotropic layer A and the optically anisotropic layer B are provided to be in direct contact with each other, in which both a composition a for forming the optically anisotropic layer A and a composition b for forming the optically anisotropic layer B contain a fluorine compound, and when the optically anisotropic layer A is formed using the composition a and then the optically anisotropic layer B is formed using the composition b, the optically anisotropic layer A and the optically anisotropic layer B are formed in this order under a condition that the composition a and the composition b satisfy both the following Equations (1) and (2), $$E_a \leq 25.2 \text{ [mN/m]} \quad (1)$$

$$E_a - E_b \geq 1.3 \text{ [mN/m]} \quad (2)$$

where $E_a$ refers to a surface tension obtained by measuring a solution, which is formed by dissolving a fluorine compound included in the composition a in a mixed solvent in which methyl ethyl ketone and cyclohexanone are mixed at a mass ratio of 1:4 in an amount that is equal to an amount included in X g of a solid content in the composition a so that a total amount of the solution is X g, in an environment of a temperature of 25° C. and a relative humidity of 60%, similarly, $E_b$ refers to a surface tension obtained by measuring a solution, which is formed by dissolving a fluorine compound included in the composition b in a mixed solvent in which methyl ethyl ketone and cyclohexanone are mixed at a mass ratio of 1:4 in an amount that is equal to an amount included in X g of a solid content in the composition b so that a total amount of the solution is X g, in an environment of a temperature of 25° C. and a relative humidity of 60%.

[2] The method of producing an optical laminate according to [1], in which either or both of the composition a and the composition b contain a liquid crystal compound.

[3] An optical laminate comprising: a transparent support; an optically anisotropic layer A; and an optically anisotropic layer B in this order, in which the optically anisotropic layer A and the optically anisotropic layer B are in direct contact with each other, both the optically anisotropic layer A and the optically anisotropic layer B contain a fluorine compound, and the optically anisotropic layer A and the optically anisotropic layer B satisfy both the following Equations (3) and (4), $$E_A \leq 25.2 \, [\text{mN/m}] \tag{3}$$

$$E_A - E_B \geq 1.3 \, [\text{mN/m}] \tag{4}$$

where $E_A$ refers to a surface tension obtained by measuring a solution, which is formed by dissolving a fluorine compound included in the optically anisotropic layer A in a mixed solvent in which methyl ethyl ketone and cyclohexanone are mixed at a mass ratio of 1:4 in an amount that is equal to an amount included in Y g of the optically anisotropic layer A so that a total amount of the solution is Y g, in an environment of a temperature of 25° C. and a relative humidity of 60%, similarly, $E_B$ refers to a surface tension obtained by measuring a solution, which is formed by dissolving a fluorine compound included in the optically anisotropic layer B in a mixed solvent in which methyl ethyl ketone and cyclohexanone are mixed at a mass ratio of 1:4 in an amount that is equal to an amount included in Y g of the optically anisotropic layer B so that a total amount of the solution is Y g, in an environment of a temperature of 25° C. and a relative humidity of 60%.

[4] A polarizing plate comprising: the optical laminate according to [3]; and a polarizing film.

[5] An organic EL display device comprising: the optical laminate according to [3] or the polarizing plate according to [4].

According to the present invention, it is possible to provide an optical laminate which is suppressed in film thickness unevenness of an optically anisotropic layer and is free from point defects, a method of producing the same, and a polarizing plate and an organic EL display device using an optical laminate.

DESCRIPTION OF THE PREFERRED EMBODIMENTS

Figure 1:
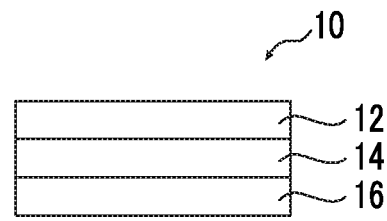
FIG. 1 is a schematic cross-sectional view showing an example of an embodiment of an optical laminate according to the present invention.

Hereinafter, the present invention will be described in detail.

The following description of the constitutional requirements is made on the basis of representative embodiments of the present invention, but it should not be construed that the present invention is limited to those embodiments.

The numerical range which is shown by "to" used in the present specification means the range including the numerical values described before and after "to" as the lower limit and the upper limit, respectively.

Next, the terms used in the present specification will be described.

$Re(\lambda)$ and $Rth(\lambda)$ represent the in-plane retardation at a wavelength $\lambda$ and the retardation in a thickness direction, respectively. $Re(\lambda)$ is measured by applying light having a wavelength of $\lambda$ nm to a film in the normal direction of the film, in KOBRA 21ADH or KOBRA WR (both manufactured by Oji Scientific Instruments). A measurement wavelength $\lambda$ nm can be selected by manually replacing a wavelength selective filter, or, the measured value can be converted by using a program or the like. The method of measuring $Re(\lambda)$ and $Rth(\lambda)$ is described in detail in paragraphs 0010 to 0012 of JP2013-041213A, the content of which is incorporated in the present specification by reference.

In the present specification, in a case in which there is no particular description regarding the measurement wavelength, the measurement wavelength is 550 nm.

Furthermore, in the present specification, an angle (for example, an angle of "90°") and an angular relationship (for example, "orthogonal", "parallel", "the same direction", and "crossing at 45°") include the margin of allowable error in the field of the related art to which the present invention belongs. At this time, the allowable error means that the margin of the error is less than a precise angle±10°. Specifically, a difference between an actual angle and the precise angle is preferably 5° or less, and more preferably 3° or less.

[Method of Producing Optical Laminate]

The method of producing an optical laminate of the present invention (hereinafter, abbreviated as a "production method of the present invention") is a production method of producing an optical laminate having an optically anisotropic layer A and an optically anisotropic layer B, in which the optically anisotropic layer A and the optically anisotropic layer B are provided to be in direct contact with each other.

In the production method of the present invention, both a composition a for forming the optically anisotropic layer A and a composition b for forming the optically anisotropic layer B contain a fluorine compound, which will be described later, and it is preferable that either or both of the compounds contain a liquid crystal compound, which will be described later.

In addition, in the production method of the present invention, the optically anisotropic layer A and the optically anisotropic layer B is formed such a manner that the optically anisotropic layer A is formed using the composition a and then the optically anisotropic layer B is formed using the composition b. At this time, under the condition that the composition a and the composition b satisfy both the following Equations (1) and (2), the optically anisotropic layer A and the optically anisotropic layer B are formed.

$$E_a \leq 25.2 \, [\text{mN/m}] \tag{1}$$

$$E_a - E_b \geq 1.3 \, [\text{mN/m}] \tag{2}$$

In the equations, $E_a$ refers to a surface tension obtained by measuring a solution, which is formed by dissolving a fluorine compound included in the composition a in a mixed solvent in which methyl ethyl ketone and cyclohexanone are mixed at a mass ratio of 1:4 in an amount that is equal to an amount included in X g of a solid content in the composition a so that a total amount of the solution is X g, in an environment of a temperature of 25° C. and a relative humidity of 60%, and similarly, $E_b$ refers to a surface tension obtained by measuring a solution, which is formed by dissolving a fluorine compound included in the composition b in a mixed solvent in which methyl ethyl ketone and cyclohexanone are mixed at a mass ratio of 1:4 in an amount that is equal to an amount included in X g of a solid content in the composition b so that a total amount of the solution is X g, in an environment of a temperature of 25° C. and a relative humidity of 60%.

Here, the aforementioned surface tension refers to a value measured by a vertical plate method (Wilhelmy method) and is a value measured under the condition of a liquid temperature of 25° C.±0.5° C. using a surface tension meter (for example, automatic surface tensiometer CBVP-Z, manufactured by Kyowa Interface Science Co., LTD.).

In the production method of the present invention, by adopting the aforementioned configuration, an optical laminate which is suppressed in film thickness unevenness of an optically anisotropic layer and is free from point defects can be prepared.

Although the reason for suppressing the film thickness unevenness of the optically anisotropic layer and eliminating point defects in the optical laminate as described above is not clear, it is assumed as follows.

First, regarding a cause of generating point defects and film thickness unevenness, it is thought that since in a conventionally known method of producing an optical laminate in which a first optically anisotropic layer (for example, a λ/2 plate), which is generally formed first, is formed and then a rubbing treatment is carried out, a fluorine compound (for example, an alignment controlling agent) present in the vicinity of the surface layer of the first optically anisotropic layer aggregates at the time of the rubbing treatment, and this aggregate is shifted to a coating liquid for forming a second optically anisotropic layer (for example, a λ/4 plate), which is formed later, to float up onto the surface thereof, a difference in surface tension is generated on the surface of the coating liquid for forming the second optically anisotropic layer.

In contrast, it is though that when in the production method of the present invention, as described above, the optically anisotropic layers A and B are formed under the condition that the composition a for the optically anisotropic layer A, which is formed first, and the composition b for the optically anisotropic layer B, which is formed later, satisfy both the following Equations (1) and (2), the aforementioned aggregate of the fluorine compound is prevented from floating up onto the surface of the cooling liquid for forming the optically anisotropic layer B, and as a result, point defects and film thickness unevenness can be suppressed.

Hereinafter, compositions used in the production method of the present invention and each treatment step will be described in detail.

[Composition a for Forming Optically Anisotropic Layer A]

The composition a for forming the optically anisotropic layer A at least contains a fluorine compound, preferably contains a liquid crystal compound, and even more preferably contains a polymerization initiator, a solvent, and the like.

<Fluorine Compound>

The fluorine compound contained in the composition a is not particularly limited as long as the compound is a compound containing a fluorine element. For example, a compound that is appropriately selected from conventionally known alignment controlling agents and surfactants to be formulated in a liquid crystal composition can be used.

Here, examples of the fluorine compound used as an alignment controlling agent include compounds (alignment film interface side vertical aligning agents) described in paragraphs of [0086] to [0101] of WO2014/073616A and compounds (air interface side vertical aligning agents) described in paragraphs of [0102] to [0113] of WO2014/073616A, the contents of which are incorporated in the present specification by reference.

In addition, examples of the fluorine compound used a surfactant include compounds described in paragraphs [0028] to [0056] of JP2001-330725A and compounds described in paragraphs [0069] to [0126] of JP2005-062673A, the contents of which are incorporated in the present specification by reference.

In the present invention, as another example of the fluorine compound, a polymer defined in claim 14 of JP2008-257205A (that is, a polymer including a constitutional unit represented by the following Formula (A) and a constitutional unit represented by the following Formula (B)), and a tilt angle controlling agent described in claim 15 of JP2008-257205A (that is, a polymer including a constitutional unit represented by the following Formula (A) and a constitutional unit derived from a fluoroaliphatic group-containing monomer) can be used. Specific examples thereof include polymers described in paragraphs [0023] to [0063] of JP2008-257205A, the content of which is incorporated in the present specification by reference.

In Formula (A), Mp represents a trivalent group constituting a part of the main chain of a polymer; L represents a single bond or a divalent linking group; and X represents a substituted or non-substituted aromatic condensed ring functional group; and in Formula (B), Mp' represents a trivalent group constituting a part of the main chain of a polymer, L' represents a single bond or a divalent linking group; and Rf represents a substituent containing at least one fluorine atom.

In the present invention, it is preferable that the fluorine compound is a polymer including at least a constitutional unit derived from a fluoroaliphatic group-containing monomer.

Here, the weight average molecular weight of such a polymer is preferably 1,000,000 or less, more preferably 500,000 or less, and even more preferably 10,000 to 100,000.

Here, the weight average molecular weight refers to a value measured in terms of polystyrene (PS) using gel permeation chromatography (GPC) and can be obtained using a column of, for example, TSKgel GMHxL, TSKgel G4000HxL, or TSKgel G2000HxL (trade names, all manufactured by TOSOH CORPORATION) and tetrahydrofuran (THF) as an eluent in a GPC analyzer.

In addition, in the present invention, the content of the fluorine compound (in the case of using two or more fluorine compounds, the total content) in the composition a is preferably 0.01% to 5% by mass, more preferably 0.05% to 1% by mass, and even more preferably 0.1% or more and less than 0.5% by mass with respect to the total solid content of the composition a due to the reason that the above Equation (1) is easily satisfied and the film thickness unevenness of the optically anisotropic layer is further suppressed.

<Liquid Crystal Compound>

Generally, the liquid crystal compound can be classified into a rod type and a disk type based on the shape thereof. Further, each of the rod type and the disk type includes a low molecular weight type and a polymer type. Generally, a polymer refers to a molecule having a degree of polymerization of equal to or greater than 100 ("Polymer Physics-Dynamics of Phase Transition", Masao Doi, p. 2, Iwanami Shoten, Publishers, 1992). In the present invention, any of the liquid crystal compounds can be used, but it is preferable to use a rod-like liquid crystal compound (hereinafter, also abbreviated as "CLC" or "CLC compound") or a discotic liquid crystal compound (disk-like liquid crystal compound) (hereinafter, also abbreviated as "DLC" or "DLC compound"). Two or more types of rod-like liquid crystal compounds, two or more types of disk-like liquid crystal compounds, or a mixture of a rod-like liquid crystal compound and a disk-like liquid crystal compound may be used. In order to fix the aforementioned liquid crystal compound, the optically anisotropic layer is more preferably formed by using a rod-like liquid crystal compound or a disk-like liquid crystal compound having a polymerizable group. Even more preferably, the liquid crystal compound has two or more polymerizable groups in a single molecule. When the liquid crystal compound is a mixture of two or more types thereof, it is preferable that at least one type of liquid crystal compound has two or more polymerizable groups in a single molecule.

As the rod-like liquid crystal compound, for example, it is possible to preferably use those described in claim 1 of JP1999-513019A (JP-H11-513019A) or in paragraphs [0026] to [0098] of JP2005-289980A. As the discotic liquid crystal compound, for example, it is possible to preferably use those described in paragraphs [0020] to [0067] of JP2007-108732A or in paragraphs [0013] to [0108] of JP2010-244038A. However, the present invention is not limited thereto.

The molecules of the liquid crystal compound are preferably fixed in any of the alignment states including vertical alignment, horizontal alignment, hybrid alignment, and tilt alignment.

Here, the hybrid alignment is an alignment state in which the angle formed between the plane of the disk of the disk-like liquid crystal compound molecule or the molecule symmetry axis of the rod-like liquid crystal compound molecule and the plane of the layer increases or decreases in the depth direction of the optically anisotropic layer as the distance from the surface of the alignment film increases.

The aforementioned angle preferably increases as the distance increases.

Furthermore, the mode of change of the angle includes continuous increase, continuous decrease, intermittent increase, intermittent decrease, and a combination of continuous increase and continuous decrease. Alternatively, the mode of change can also be intermittent change including increase and decrease. The mode of intermittent change includes a region in which the tilt angle does not change in the middle of the thickness direction.

The aforementioned angle may not change in a certain region as long as the angle increases or decreases as a whole. However, the angle preferably changes continuously. Needless to say, an alignment state may also be adopted in which all the liquid crystal compound molecules are uniformly tilted.

As the embodiment in which the liquid crystal compound is fixed in the hybrid alignment state as described above, an embodiment in which the optically anisotropic layer is used as an optical compensation film of a liquid crystal display device adopting a twisted alignment mode is exemplified. Specifically, those described in paragraphs [0123] to [0126] of JP2012-3183A can be used, but the present invention is not limited thereto.

On the other hand, the alignment state of the liquid crystal compound is controlled to make the optically anisotropic layer function as a $\lambda/4$ plate.

Here, the $\lambda/4$ plate (a plate having a $\lambda/4$ function) is a plate having a function of converting linearly polarized light at a specific wavelength into circularly polarized light (or converting circularly polarized light into linearly polarized light). More specifically, it is a plate in which a value of in-plane retardation at a predetermined wavelength $\lambda$ nm becomes $\lambda/4$ (or an odd multiple thereof).

The material constituting the $\lambda/4$ plate is not particularly limited as long as it exhibits the characteristics described above. As the material, an embodiment in which the $\lambda/4$ plate contains a liquid crystal compound as described above for the aforementioned optically anisotropic layer (for example, an optically anisotropic layer containing a homogeneously aligned liquid crystal compound), a polymer film, and the like are exemplified. Among these, from the viewpoint of easily controlling the aforementioned characteristics, the $\lambda/4$ plate preferably contains a liquid crystal compound. More specifically, the $\lambda/4$ plate is preferably a layer formed by fixing a liquid crystal compound (a rod-like liquid crystal compound or a discotic liquid crystal compound) having a polymerizable group by means of polymerization or the like. In this case, after being formed into a layer by fixing, the liquid crystal compound does not need to exhibit liquid crystallinity.

At this time, in the case in which a rod-like liquid crystal compound is used, the rod-like liquid crystal compound is preferably fixed in a horizontal alignment state. In the case in which a discotic liquid crystal compound is used, the discotic liquid crystal compound is preferably fixed in a vertical alignment state. Herein, in the present invention, the phrase "the rod-like liquid crystal compound is in a horizontal alignment state" means that a director of the rod-like liquid crystal compound is parallel to the plane of the layer. In addition, the phrase "the discotic liquid crystal compound is in a vertical alignment state" means that the plane of the disk of the discotic liquid crystal compound is perpendicular to the plane of the layer. However, the phrases do not mean that the liquid crystal compound needs to be precisely horizontally or vertically aligned, but means that there may be a difference within a range of $\pm 20°$ from the precise angle. The difference is preferably within $\pm 5°$, more preferably within $\pm 3°$, even more preferably within $\pm 2°$, and most preferably within $\pm 1°$.

<Polymerization Initiator>

It is preferable that the liquid crystal composition causes the liquid crystal compound to polymerize using a polymerization initiator from the viewpoint of maintaining and fixing the alignment state of the aforementioned liquid crystal compound.

The polymerization initiator to be used may adopt a thermal polymerization initiator or a photopolymerization initiator according to the polymerization reaction system. Examples of the photopolymerization initiator include $\alpha$-carbonyl compounds, acyloinethers, $\alpha$-hydrocarbon-substituted aromatic acyloin compounds, polynuclear quinone compounds, a combination of triarylimidazole dimer and p-aminophenylketone, acridine and phenazine compounds, and oxadiazole compounds.

The amount of the polymerization initiator to be used is preferably 0.01% by mass to 20% by mass and more preferably 0.5% by mass to 5% by mass with respect to the total solid content of the composition a.

<Solvent>

The composition a may include a solvent and an organic solvent is preferably used.

Specific examples of the organic solvent include amides (for example, N,N-dimethylformamide), sulfoxides (for example, dimethylsulfoxide), heterocyclic compounds (for example, pyridine), hydrocarbons (for example, benzene, hexane), alkyl halides (for example, chloroform, and dichloromethane), esters (for example, methyl acetate, ethyl acetate, and butyl acetate), ketones (for example, acetone, and methyl ethyl ketone), ethers (for example, tetrahydrofuran, and 1,2-dimethoxyethane). These solvents may be used alone or in combination of two or more thereof.

Among these, alkyl halides and ketones are preferable.

<Other Additives>

In the present invention, by using a plasticizer and the like together with the aforementioned fluorine compound and an arbitrary liquid crystal compound, the uniformity of the coating film, the strength of the film, the alignment of the liquid crystal compound, and the like can be improved.

[Composition b for Forming Optically Anisotropic Layer B]

The composition b for forming the optically anisotropic layer B contains at least a fluorine compound, preferably contains a liquid crystal compound, and more preferably contains a polymerization initiator, a solvent, and the like.

Here, regarding the fluorine compound, and arbitrary liquid crystal compound, polymerization initiator, and solvent included in the composition b, the same materials as shown in the description of the aforementioned composition a can be used.

<Fluorine Compound>

As the fluorine compound contained in the composition b, as described above, the same fluorine compound as the fluorine compound contained in the composition a can be used. The content of the fluorine compound contained in the composition b (in the case of using two or more fluorine compounds, the total content) is preferably 0.1% to 10% by mass, more preferably 0.3% to 5% by mass, and even more preferably 0.5 to 3% by mass with respect to the total solid content of the composition b due to the reason that the above Equation (2) is easily satisfied and the generation of point defects can be more reliably suppressed.

In addition, due to the same reason, among polymers including at least a constitutional unit derived from a fluoroaliphatic group-containing monomer, which is a suitable example, the fluorine compound contained in the composition b is preferably a monopolymer or a copolymer in which the content of the constitutional unit is 50% by mass or more.

[Relation Between Composition a and Composition b]

In the production method of the present invention, the optically anisotropic layer A and the optically anisotropic layer B are formed in this order under the condition that the composition a and the composition b satisfy both the following Equations (1) and (2) as described above.

$$E_a \leq 25.2 \text{ [mN/m]} \quad (1)$$

$$E_a - E_b \geq 1.3 \text{ [mN/m]} \quad (2)$$

In the above Equations (1) and (2), $E_a$ refers to a surface tension obtained by measuring a solution, which is formed by dissolving a fluorine compound included in the composition a in a mixed solvent in which methyl ethyl ketone and cyclohexanone are mixed at a mass ratio of 1:4 in an amount that is equal to an amount included in X g of a solid content in the composition a so that a total amount of the solution is X g, in an environment of a temperature of 25° C. and a relative humidity of 60%, Here, the expression "solution, which is formed by dissolving . . . in a mixed solvent . . . in an amount that is equal to an amount included in X g of a solid content in the composition a so that a total amount of the solution is X g" means that, for example, when X=10 g, in the case in which 1 g of a fluorine compound and 9 g of a liquid crystal compound are included in 10 g of a solid content in the composition a, 1 g of a fluorine compound is dissolved in 9 g of the aforementioned mixed solvent to obtain 10 g of a solution.

Similarly, in the above Equation (2), $E_b$ refers to a surface tension obtained by measuring a solution, which is formed by dissolving a fluorine compound included in the composition b in a mixed solvent in which methyl ethyl ketone and cyclohexanone are mixed at a mass ratio of 1:4 in an amount that is equal to an amount included in X g of a solid content in the composition b so that a total amount of the solution is X g, in an environment of a temperature of 25° C. and a relative humidity of 60%.

Here, the expression "solution, which is formed by dissolving . . . in a mixed solvent . . . in an amount that is equal to an amount included in X g of a solid content in the composition b so that a total amount of the solution is X g" means that, for example, when X=10 g, in the case in which 1 g of a fluorine compound and 9 g of a liquid crystal compound are included in 10 g of a solid content in the composition b, 1 g of a fluorine compound is dissolved in 9 g of the aforementioned mixed solvent to obtain 10 g of a solutions.

In the present invention, due to the reason that the film thickness unevenness of the optically anisotropic layer is further suppressed and the generation of point defects can be more reliably suppressed, it is preferable that under the condition that the composition a and the composition b satisfy both the following Equations (1a) and (2), the optically anisotropic layer A and the optically anisotropic layer B are formed in this order.

$$E_a \leq 24.7 \text{ [mN/m]} \quad (1a)$$

[Treatment Step]

The production method of the present invention is not particularly limited in each treatment step such as a coating method and an alignment treatment as long as the method is a method of forming the optically anisotropic layer A and the optically anisotropic layer B in this order using the aforementioned composition a and composition b under the condition that the aforementioned composition a and composition b satisfy both the Equations (1) and (2).

Examples of such treatment steps include the following Steps (1) to (6). Regarding the conditions for coating, a heating treatment, a curing treatment, and rubbing in the following Steps (1) to (6), each step in the method of producing a phase difference plate described in paragraphs [0129] to [0136] of WO2014/073616A can be appropriately adopted.

Step (1): providing an alignment film on a transparent support

Step (2): applying a coating liquid a containing a fluorine compound and a liquid crystal compound A (for example, discotic liquid crystal compound) to the alignment film and carrying out a heating treatment, as required, to align the liquid crystal compound A Step (3): subjecting the liquid crystal compound A to a curing treatment to form an optically anisotropic layer A Step (4): carrying out rubbing on the optically anisotropic layer A Step (5): applying a composition b containing a fluorine compound and a liquid crystal compound B (for example, rod-like liquid crystal compound) to the rubbed optically anisotropic layer A and carrying out a heating treatment, as required, to align the liquid crystal compound B Step (6): carrying out a curing treatment to the liquid crystal compound B to form an optically anisotropic layer B

[Optical Laminate]

The optical laminate of the present invention is an optical laminate having a transparent support, an optically anisotropic layer A, and an optically anisotropic layer B in this order, in which the optically anisotropic layer A and the optically anisotropic layer B are provided to be in direct contact with each other.

In the optical laminate of the present invention, it is preferable that both the optically anisotropic layer A and the optically anisotropic layer B contain a fluorine compound and either or both of the optically anisotropic layers contain a liquid crystal compound, which will be described later.

In addition, in the optical laminate of the present invention, both the following Equations (3) and (4) are satisfied.

$$E_A \leq 25.2 \text{ [mN/m]} \quad (3)$$

$$E_A - E_B \geq 1.3 \text{ [mN/m]} \quad (4)$$

In the equations, $E_A$ refers to a surface tension obtained by measuring a solution, which is formed by dissolving a fluorine compound included in the optically anisotropic layer A in a mixed solvent in which methyl ethyl ketone and cyclohexanone are mixed at a mass ratio of 1:4 in an amount that is equal to an amount included in Y g of the optically anisotropic layer A so that a total amount of the solution is Y g, in an environment of a temperature of 25° C. and a relative humidity of 60%, and similarly, $E_B$ refers to a surface tension obtained by measuring a solution, which is formed by dissolving a fluorine compound included in the optically anisotropic layer B in a mixed solvent in which methyl ethyl ketone and cyclohexanone are mixed at a mass ratio of 1:4 in an amount that is equal to an amount included in Y g of the optically anisotropic layer B so that a total amount of the solution is Y g, in an environment of a temperature of 25° C. and a relative humidity of 60%.

Here, the method of measuring the surface tension is the same as the measurement method described in the aforementioned production method of the present invention.

In the description of $E_A$, the expression "solution, which is formed by dissolving . . . in a mixed solvent . . . in an amount that is equal to an amount included in Y g of the optically anisotropic layer A so that a total amount of the solution is Y g" means that, for example, when Y=10 g, in the case in which 1 g of a fluorine compound and 9 g of a fixed or polymerized liquid crystal compound are included in 10 g of the optically anisotropic layer A, 1 g of the fluorine compound is dissolved in 9 g of the aforementioned mixed solvent to obtain 10 g of a solution.

Similarly, in the description of $E_B$, the expression "solution, which is formed by dissolving . . . in a mixed solvent . . . in an amount that is equal to an amount included in Y g of the optically anisotropic layer B so that a total amount of the solution is Y g" means that, for example, when Y=10 g, in the case in which 1 g of a fluorine compound and 9 g of a fixed or polymerized liquid crystal compound are included in 10 g of the optically anisotropic layer B, 1 g of the fluorine compound is dissolved in 9 g of the aforementioned mixed solvent to obtain 10 g of a solution.

When the optical laminate of the present invention adopts the aforementioned configuration, an optical laminate which is suppressed in film thickness unevenness of an optically anisotropic layer and is free from point defects is obtained.

Although the reason for suppressing the film thickness unevenness of the optically anisotropic layer and eliminating point defects in the optical laminate as described above is not clear, it is assumed as follows.

That is, it is though that since the optically anisotropic layer A and the optically anisotropic layer B satisfy both the following Equations (3) and (4), as in the aforementioned production method of the present invention, an aggregate of the fluorine compound in the optically anisotropic layer A is prevented from flowing up onto the surface of the coating liquid for forming an optically anisotropic layer B and as a result, point defects and film thickness unevenness can be suppressed.

FIG. 1 is a cross-sectional view schematically showing an example of an embodiment of an optical laminate according to the present invention.

An optical laminate 10 shown in FIG. 1 has a transparent support 12, an optically anisotropic layer (A) 14, and an optically anisotropic layer (B) 16 in this order.

Hereinafter, each layer constituting the optical laminate of the present invention will be described in detail.

[Transparent Support]

The transparent support that the optical laminate of the present invention has is a substrate which supports the optically anisotropic layer A and the optically anisotropic layer B.

Here, examples of the materials and additives for forming the transparent support, the thickness of the transparent support, and the like include materials and the like described in paragraphs of [0020] to [0023] of WO2014/073616A, the content of which is incorporated in the present specification by reference.

[Optically Anisotropic Layer A]

The optically anisotropic layer A that the optical laminate of the present invention has is not particularly limited as long as the optically anisotropic layer contains at least a fluorine compound. It is preferable that the optically anisotropic layer is formed of a composition containing a liquid crystal compound and it is more preferable that the optically anisotropic layer is formed of the aforementioned composition a described in the production method of the present invention.

Since the optical laminate of the present invention has the optically anisotropic layer A and the optically anisotropic layer B, which will be described later, as described above, it is preferable that the optical laminate functions as, for example, a broadband λ/4 plate composed of λ/4 plate and a λ/2 plate laminated on each other. In the broadband λ/4 plate, an angle formed between the in-plane slow axis of the λ/4 plate and the in-plane slow axis of the λ/2 plate is preferably 60°.

In addition, the method of forming the λ/4 plate is not particularly limited, and a known method can be adopted. For example, a method of producing a broadband λ/4 plate described in paragraph [0097] of JP2004-238431A and a method of producing a phase difference plate described in paragraphs [0129] to [0136] of WO2014/073616A may be used.

[Optically Anisotropic Layer B]

The optically anisotropic layer B that the optical laminate of the present invention has is not particularly limited as long as the optically anisotropic layer contains at least a fluorine compound. It is preferable that the optically anisotropic layer is formed of a composition containing a liquid crystal compound and it is more preferable that the optically anisotropic layer is formed of the aforementioned composition b described in the production method of the present invention.

[Alignment Film]

The optical laminate of the present invention may have an alignment film between the aforementioned transparent support and the optically anisotropic layer A.

The alignment film generally includes a polymer as a main component. The polymer material for the alignment film is described in many documents, and a large number of commercial products are available. As the polymer material used in the present invention, polyvinyl alcohol, polyimide, and derivatives of these are preferable. Particularly, modified or unmodified polyvinyl alcohol is preferable. Regarding the alignment film which can be used in the present invention, the modified polyvinyl alcohol described on p. 43, line 24 to p. 49, line 8 of WO01/88574A1 and in paragraphs [0071] to [0095] of JP3907735B can be referred to.

From the viewpoint of oxygen permeability, it is preferable that the alignment film has a small thickness. However, from the viewpoint of imparting an alignment ability for forming an optically anisotropic layer and from the viewpoint of forming an optically anisotropic layer having a uniform film thickness by mitigating the irregularity of the support surface, the alignment film needs to have a certain thickness. Specifically, the thickness of the alignment film is preferably 0.01 to 10 µm, more preferably 0.01 to 1 µm, and even more preferably 0.01 to 0.5 µm.

In the present invention, it is preferable to use an optical alignment film. The optical alignment film is not particularly limited, and it is possible to use those described in paragraphs [0024] to [0043] of WO2005/096041A, LPP-JP265CP (trade name) manufactured by Rolic technologies, and the like.

[Polarizing Plate]

The polarizing plate of the present invention is a polarizing plate having the aforementioned optical laminate of the present invention and a polarizing film.

The polarizing plate of the present invention having the aforementioned configuration functions as a circularly polarizing plate in an embodiment in which the aforementioned optical laminate of the present invention functions as a λ/4 plate (for example, a broadband λ/4 plate composed of a λ/4 plate and a λ/2 plate laminated on each other).

In such an embodiment, the polarizing plate of the present invention (circularly polarizing plate) is suitably used for the purpose of anti-reflection for an image display device such as a liquid crystal display device, a plasma display panel (PDP), an electroluminescence display (ELD), or a cathode ray tube (CRT) and the contrast ratio of display light can be improved.

For example, an embodiment in which the circularly polarizing plate of the present invention is used on the light extraction surface side of the organic EL display device may be used. In this case, external light is converted into linearly polarized light by a polarizing film, and then the linearly polarized light passes through a phase difference plate to be converted into circularly polarized light. The circularly polarized state is reversed when the circularly polarized light is reflected by a metal electrode and when the light passes through the phase difference plate again, the light is converted into linearly polarized light tilted at 90° from the time of light incidence and reaches a polarizing film to be absorbed. As a result, the effect of external light can be suppressed.

Figure 2A:
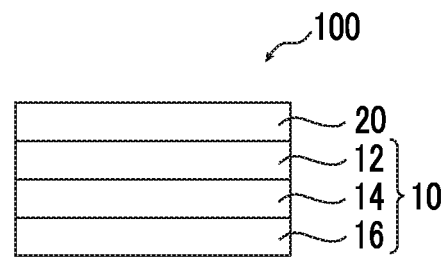
FIGS. 2A to 2C are schematic cross-sectional views showing examples of an embodiment of a polarizing plate according to the present invention, respectively.
Figure 2B:
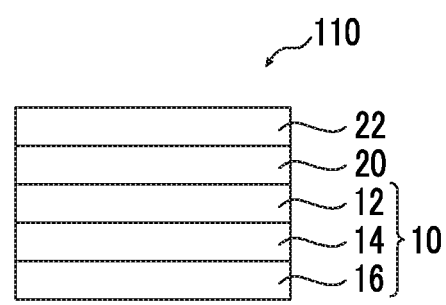
Figure 2C:
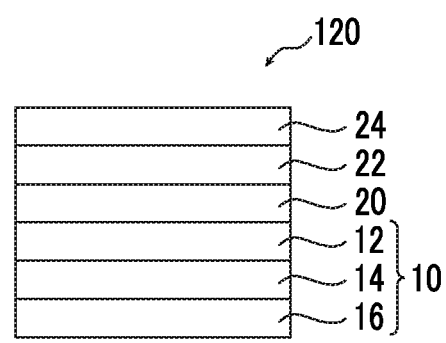

FIGS. 2A to 2C are schematic cross-sectional views showing examples of an embodiment of the polarizing plate of the present invention, respectively.

A polarizing plate 100 shown in FIG. 2A has an optical laminate 10 and a polarizing film 20.

As shown in FIG. 2B, a polarizing plate 110 may have a protective film 22 as well as the optical laminate 10 and the polarizing film 20.

Further, as shown in FIG. 2C, a polarizing plate 120 has an optical laminate 10, the polarizing film 20, the protective film 22, and a functional layer 24. As the functional layer 24, at least one selected from the group consisting of an anti-reflection layer, an antiglare layer, and a hardcoat layer may be used. Known layer materials may be used for these layers. These layers may be laminated in plural.

Hereinafter, among each layers constituting the polarizing plate of the present invention, layers other than the aforementioned optical laminate of the present invention will be described.

[Polarizing Film]

As the polarizing film (polarizer layer) having the polarizing plate of the present invention, any member can be used as long as the member has a function of converting natural light into specific linearly polarized light, and an absorption-type polarizer can be used.

The type of the polarizing film is not particularly limited and a polarizing film that is typically used can be used. For example, any of an iodine-containing polarizing film, a dye-based polarizing film using a dichroic dye, and a polyene-based polarizing film can be used. The iodine-containing polarizing film and the dye-based polarizing film are generally prepared by allowing polyvinyl alcohol to adsorb iodine or a dichroic dye and stretching the polyvinyl alcohol film.

The polarizing film is generally used in the form of a polarizing plate having a protective film laminated on both surfaces thereof.

[Protective Film]

The protective film that the polarizing plate of the present invention may have is not particularly limited and a typically used polymer film can be used.

Specific examples of polymers constituting the polymer film include cellulose-based polymers; acrylic polymers having an acrylic ester polymer such as polymethyl methacrylate and a lactone ring-containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and mixtures of these polymers.

[Functional Layer]

As the functional layer that the polarizing plate of the present invention may have, for example, at least one selected from the group consisting of an antireflection layer, an antiglare layer, and a hardcoat layer may be used as described above. Known layer materials may be used for these layers. These layers may be laminated in plural.

For example, the simplest configuration for an antireflection layer is a configuration in which only a low refractive index layer is applied to the outermost surface of the film. Further, in order to lower the reflectivity, it is preferable that an antireflection layer is configured by combining a high refractive index layer having a high refractive index, and a low refractive index layer having a low refractive index. Examples of configurations include a configuration in which two layers of high refractive index layer/low refractive index layer are sequentially laminated from the lower side, and a configuration in which three layers having different refractive indexes are laminated in order of middle refractive index layer (layer having a refractive index higher than that of an underlayer and lower than that of a high refractive index layer)/high refractive index layer/low refractive index layer sequentially laminated. Further, a laminate of more antireflection layers is proposed. Among these, from the viewpoint of durability, optical properties, costs, and productivity, it is preferable to provide layers in order of middle refractive index layer/high refractive index layer/low refractive index layer on a hardcoat layer, and examples thereof include configurations described in JP1996-122504A (JP-H08-122504A), JP1996-110401A (JP-H08-110401A), JPI998-300902A (JP-H10-300902A), JP2002-243906A, and JP2000-111706A. In addition, an antireflection film having a three-layer configuration excellent in robustness to film thickness variation is described in JP2008-262187A. The average reflectivity of the antireflection film having a three-layer configuration can be set to 0.5% or less in the case in which the antireflection film is placed on the surface of an image display device, and reflected glare can be remarkably reduced. Thus, it is possible to obtain an image having excellent cubic effect. In addition, other functions may be imparted to each layer and examples thereof include an antifouling low refractive index layer, an antistatic high refractive index layer, an antistatic hardcoat layer, and an antiglare hardcoat layer, (for example, refer to JP1998-206603A (JP-H10-206603A), JP2002-243906A, and JP2007-264113A).

[Organic EL Display Device]

The organic EL display device of the present invention is an organic EL display device having the aforementioned optical laminate of the present invention or the polarizing plate of the present invention.

Figure 3A:
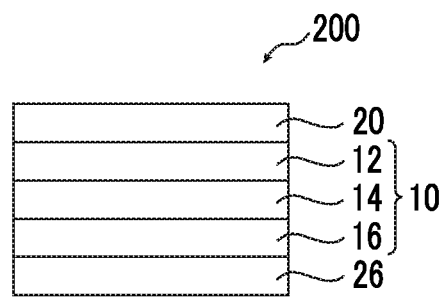
FIGS. 3A to 3C are schematic cross-sectional views showing examples of an embodiment of an organic EL display device according to the present invention, respectively.
Figure 3B:
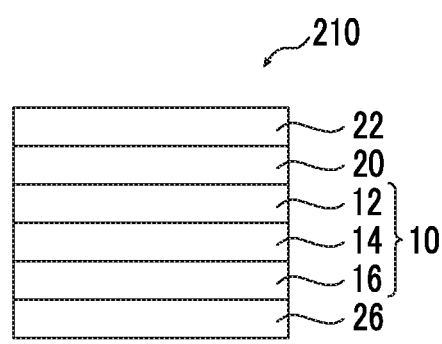
Figure 3C:
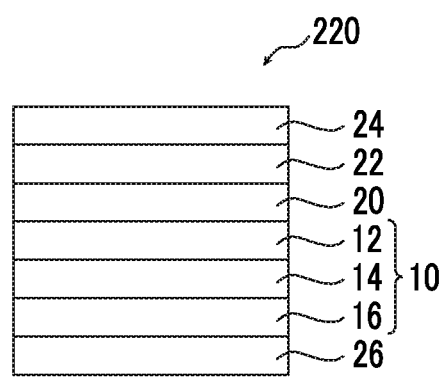

FIGS. 3A to C are schematic cross-sectional views showing examples of an embodiment of an organic EL display device according to the present invention, respectively.

The organic EL display device shown in FIG. 3A has at least an organic EL panel 26, the optical laminate 10, and the polarizing film 20.

In addition, as shown FIG. 3B, an organic EL display device 210 may further have the protective film 22 on the polarizing film 20 and as shown in FIG. 3C, an organic EL display device 220 may have the protective film 22 and the functional layer 24 on the polarizing film 20.

The organic EL panel is a member in which a light emitting layer or plural organic compound thin films including a light emitting layer are formed between one pair of electrodes of anode and cathode and may have a hole injecting layer, a hole transporting layer, an electron injecting layer, an electron transporting layer and a protective layer in addition to the light emitting layer. Each of these layers may have different functions. Various materials may be used for forming individual layers.

The anode supplies holes for a hole injecting layer, a hole transporting layer or a light emitting layer, a metal, an alloy, a metal oxide, an electrically conductive compound or a mixture thereof can be used, and materials having a work function of 4 eV or more are preferable. Specific examples thereof include conductive metal oxides such as tin oxide, zinc oxide, indium oxide and indium tin oxide (ITO), metals such as gold, silver, chromium and nickel, mixtures or laminates of the metals and the conductive metal oxides, inorganic conductive substances such as copper iodide and copper sulfide, organic conductive materials such as polyaniline, polythiophene and polypyrrole; and laminates thereof with ITO. Conductive metal oxides are preferable, and ITO is particularly preferred from the view of productivity, high conductivity and transparency. The film thickness of the anode can properly be selected depending on materials constituting the anode, but is typically preferably within the range of 10 nm to 5 µm, more preferably 50 nm to 1 µm, and still more preferably 100 nm to 500 nm.

EXAMPLES

Hereinafter, the present invention will be more specifically described based on examples. The materials, the amount of the materials used, the ratio between the materials, the content and the procedures of treatment, and the like shown in the following examples can be appropriately modified as long as the modification does not depart from the gist of the present invention. Accordingly, the scope of the present invention is not limited to the following specific examples.

Example 1

<Preparation of Transparent Support A>

The following composition was put into a mixing tank and was stirred while being heated to dissolve the respective components, thereby preparing a cellulose acylate solution A.

| Composition of Cellulose Acylate Solution A | |
|---|---|
| Cellulose acetate having a substitution degree of 2.86 | 100 parts by mass |
| Triphenyl phosphate (plasticizer) | 7.8 parts by mass |
| Biphenyl diphenyl phosphate (plasticizer) | 3.9 parts by mass |
| Methylene chloride (first solvent) | 300 parts by mass |
| Methanol (second solvent) | 54 parts by mass |
| 1-Butanol | 11 parts by mass |

The following composition was put into another mixing tank and was stirred while being heated to dissolve the respective components, thereby preparing an additive solution B.

| Composition of Additive Solution B | |
|---|---|
| Compound B1 below (Re lowering agent) | 40 parts by mass |
| Compound B2 below (wavelength dispersion controlling agent) | 4 parts by mass |

-continued

| Composition of Additive Solution B | |
|---|---|
| Methylene chloride (first solvent) | 80 parts by mass |
| Methanol (second solvent) | 20 parts by mass |

Compound B1

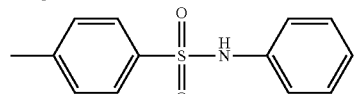

Compound B2

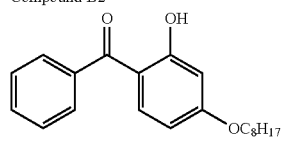

40 parts by mass of the additive solution B was added to 477 parts by mass of the cellulose acylate solution A, and the resultant solution was sufficiently stirred, thereby preparing a dope. The dope was cast onto a drum cooled to 0° C. from a casting port. The film was peeled off in a state in which the content of the solvent was 70% by mass. In a state in which both ends of the film in the width direction were gripped by a pin tenter (pin tenter described in FIG. 3 in JP1992-1009A (JP-H04-1009A)) and the content of the solvent was 3% to 5% by mass, the film was dried while maintaining a space in which the stretching ratio in the horizontal direction (a direction vertical to the machine direction) was 3%. Then, the film was then further dried by being transported between rolls of a heat treatment device, thereby preparing a cellulose acetate protective film (transparent support A) having a thickness of 60 μm.

The transparent support A did not contain an ultraviolet absorber and had an Re(550) of 0 nm and an Rth(550) of 12.3 nm.

<Alkali Saponification Treatment>

The cellulose acetate transparent support A was allowed to pass between induction heating rolls at a temperature of 60° C. to increase the surface temperature of the film to 40° C. Then, an alkali solution of the following composition was applied to one surface of the film in a coating amount of 14 ml/m$^2$ using a bar coater, heated to 110° C., and then transported for 10 seconds under a steam type infrared ray heater (manufactured by NORITAKE Co., Limited). Subsequently, pure water was applied in an amount of 3 ml/m$^2$ similarly using a bar coater. Next, after repeating 3 times the procedures of washing with water by a fountain coater and removing water by an air knife, the film was transported to a 70° C. drying zone to be dried for 10 seconds, and thus a cellulose acetate transparent support A subjected to an alkali saponification treatment was prepared.

| Composition of Alkali Solution (parts by mass) | |
|---|---|
| Potassium hydroxide | 4.7 parts by mass |
| Water | 15.8 parts by mass |
| Isopropanol | 63.7 parts by mass |
| Surfactant SF-1: $C_{14}H_{29}O(CH_2CH_2O)_{20}H$ | 1.0 part by mass |
| Propylene glycol | 14.8 parts by mass |

<Formation of Alignment Film>

An alignment film forming coating liquid having the following composition was continuously applied to the surface of the prepared transparent support A, which had been subjected to the saponification treatment, using a #8 wire bar. The coated film was dried for 60 seconds with hot air at 60° C. and further dried for 120 seconds with hot air at 100° C. to form an alignment film.

| Composition of Alignment Film Forming Coating Liquid | |
|---|---|
| Polymer material for alignment film (PVA 103, polyvinyl alcohol, manufactured by Kuraray Co., Ltd.) | 4.0 parts by mass |
| Methanol | 36 parts by mass |
| Water | 60 parts by mass |

<Formation of Optically Anisotropic Layer A>

The surface of the prepared alignment film was continuously subjected to a rubbing treatment in a direction inclined at 15° toward the right direction with respect to the longitudinal direction of the transparent support A. The optically anisotropic layer coating liquid (composition a) shown below was applied to the rubbed surface using a geeser coater. Next, the coating liquid was heated and aged at a film surface temperature of 128° C. for 40 seconds and then cooled to 90° C. The coating layer was irradiated with ultraviolet rays in air at an irradiation dose of 300 mJ/cm$^2$ using an air-cooled metal halide lamp (manufactured by Eye Graphics Co., Ltd.) of 20 mW/cm$^2$ so as to fix the alignment state thereof. Thus, an optically anisotropic layer A was formed. In the formed optically anisotropic layer A, the discotic liquid crystal was vertically aligned in a state in which the direction of the slow axis thereof was orthogonal to the rubbing direction. The values of retardation of the optically anisotropic layer A at wavelengths of 450 nm, 550 nm, and 650 nm were as follows. Here, the thickness of the optically anisotropic layer A was 1.8 μm.

Re450A: 262 nm
Re550A: 240 nm
Re650A: 230 nm
Re450A/Re650A: 1.14

| Composition of Optically Anisotropic Layer Coating Liquid (Composition a) | |
|---|---|
| Discotic liquid crystal compound E-1 below | 80 parts by mass |
| Discotic liquid crystal compound E-2 below | 20 parts by mass |
| Alignment film interface aligning agent 1 below | 0.55 parts by mass |
| Alignment film interface aligning agent 2 below | 0.05 parts by mass |
| Fluorine compound FP-1 below | 0.21 parts by mass |
| Modified trimethylolpropane triacrylate below | 5 parts by mass |
| Photopolymerization initiator (Irgacure 907, manufactured by Ciba Specialty Chemicals, Inc.) | 3.0 parts by mass |
| Interlayer aligning agent below | 1.2 parts by mass |
| Methyl ethyl ketone | 200 parts by mass |

-continued
Composition of Optically Anisotropic Layer Coating Liquid (Composition a)
Discotic liquid crystal compound E-1
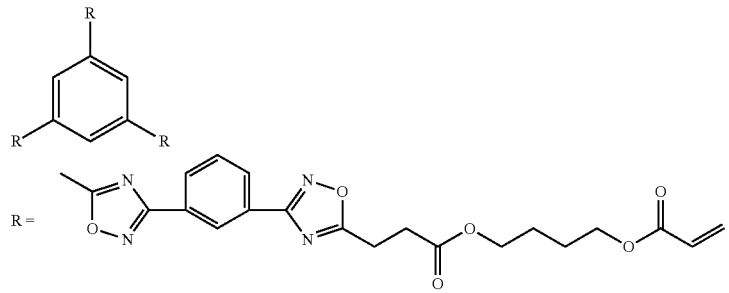
Discotic liquid crystal compound E-2
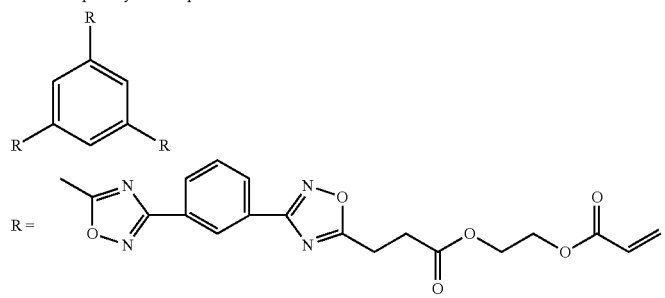
Alignment film interface aligning agent 1
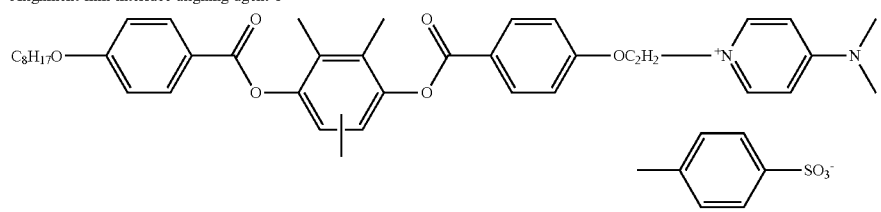
Alignment film interface aligning agent 2
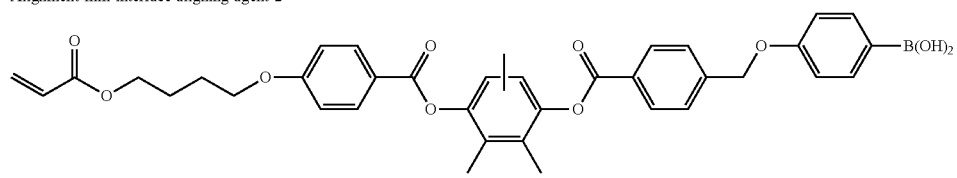
Fluorine compound FP-1
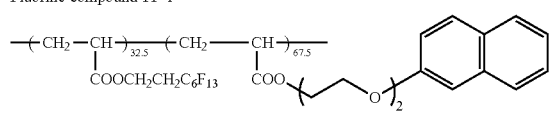
Modified trimethylolpropane triacrylate
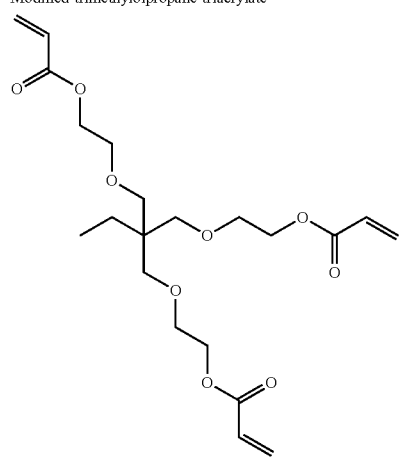

| Composition of Optically Anisotropic Layer Coating Liquid (Composition a) |
|---|

Interlayer aligning agent

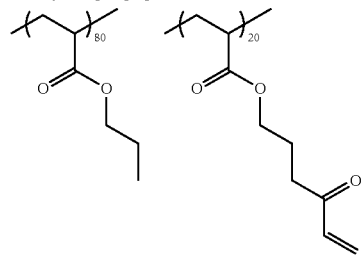

<Formation of Optically Anisotropic Layer B>

The surface of the optically anisotropic layer A was continuously subjected to a rubbing treatment in a direction inclined at 15° toward the left direction with respect to the longitudinal direction of the transparent support A. The optically anisotropic layer coating liquid (composition b) shown below was applied to the rubbed surface using a bar coater. Next, the coating liquid was heated and aged at a film surface temperature of 40° C. for 80 seconds and irradiated with ultraviolet rays in air using an air-cooled metal halide lamp (manufactured by Eye Graphics Co., Ltd.) of 20 mW/cm$^2$ so as to fix the alignment state. Thus, an optically anisotropic layer B was formed to prepare an optical laminate. In the formed optically anisotropic layer B, the rod-like liquid crystal was horizontally aligned in a state in which the direction of the slow axis thereof was parallel to the rubbing direction. The values of retardation of the optically anisotropic layer B at wavelengths of 450 nm, 550 nm, and 650 nm were as follows. Here, the thickness of the optically anisotropic layer B was 1.0 μm.

Re450B: 141 nm
Re550B: 125 nm
Re650B: 120 nm
Re450B/Re650B: 1.18

| Composition of Optically Anisotropic Layer Coating Liquid (Composition b) | |
|---|---|
| Rod-like liquid crystal compound 1 below | 70 parts by mass |
| Rod-like liquid crystal compound 2 below | 30 parts by mass |
| Photopolymerization initiator | 3.0 parts by mass |
| (Irgacure 907, manufactured by Ciba Specialty Chemicals, Inc.) | |
| Sensitizer (Kayacure DETX, manufactured by Nippon Kayaku Co., Ltd.) | 1.0 part by mass |
| Fluorine compound FP-1 below | 1.0 part by mass |
| Fluorine compound FP-2 below | 0.5 parts by mass |
| Methyl ethyl ketone | 400 parts by mass |

Rod-like liquid crystal compound 1

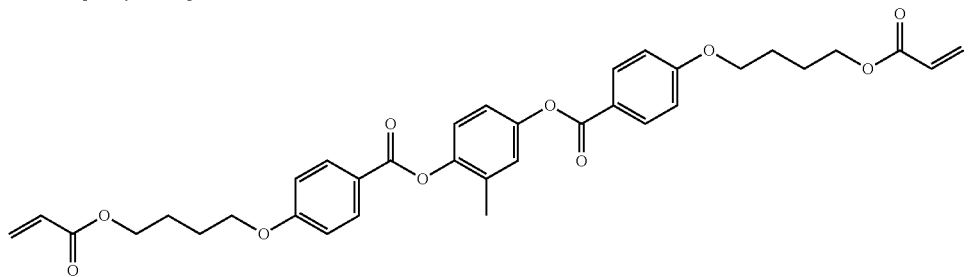

Rod-like liquid crystal compound 2

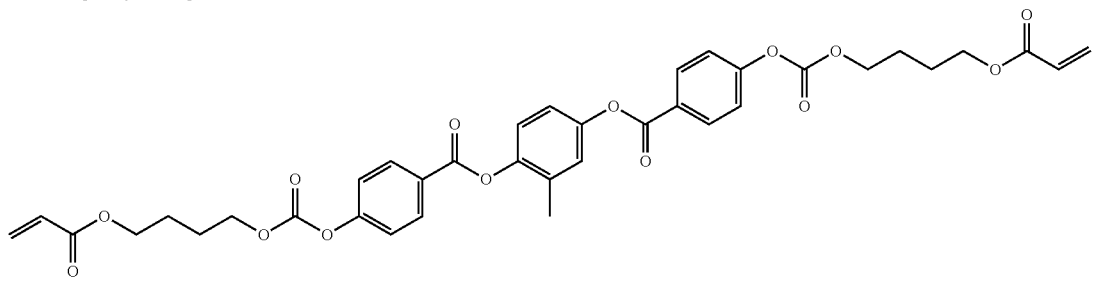 [SMILES: C=CC(=O)OCCCCOC(=O)Oc1ccc(C(=O)Oc2ccc(OC(=O)c3ccc(OC(=O)OCCCCOC(=O)C=C)cc3)c(C)c2)cc1]

Fluorine compound FP-1

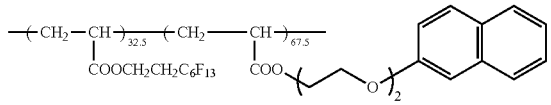

-continued

Composition of Optically Anisotropic Layer Coating Liquid (Composition b)

Fluorine compound FP-2

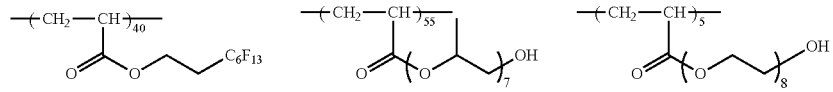

Examples 2 to 4

Optical laminates were prepared in the same manner as in Example 1 except that in the composition a, instead of using the fluorine compound FP-1, the following fluorine compound FP-3 was used and in the composition b, the amount of the fluorine compound FP-2 added was changed to the amount of addition shown in Table 1 below.

-continued

Composition of Optically Anisotropic Layer Coating Liquid (Composition a)

| | |
|---|---|
| Fluorine compound FP-3 above | 0.21 parts by mass |
| Methyl ethyl ketone | 200 parts by mass |

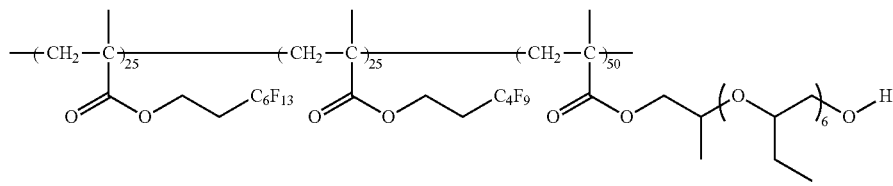

Fluorine compound FP-3

Examples 5 and 6

Optical laminates were prepared in the same manner as in Example 1 except that in the composition a, instead of using the fluorine compound FP-1, the fluorine compound FP-2 was used and in the composition b, instead of using the fluorine compound FP-1 and the fluorine compound FP-2, the following fluorine compound FP-4 was incorporated in the amount of addition shown in Table 1 below.

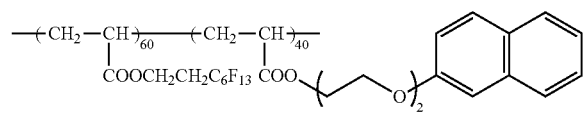

Fluorine compound FP-4

Example 7

An optical laminate was prepared in the same manner as in Example 2 except that the composition a shown below was used to form an optically anisotropic layer A.

Composition of Optically Anisotropic Layer Coating Liquid (Composition a)

| | |
|---|---|
| Rod-like liquid crystal compound 1 above | 70 parts by mass |
| Rod-like liquid crystal compound 2 above | 30 parts by mass |
| Photopolymerization initiator (Irgacure 907, manufactured by Ciba Specialty Chemicals, Inc.) | 3.0 parts by mass |
| Sensitizer (Kayacure DETX, manufactured by Nippon Kayaku Co., Ltd.) | 1.0 part by mass |

Example 8

An optical laminate was prepared in the same manner as in Example 5 except that the composition a shown below was used to form an optically anisotropic layer A.

Composition of Optically Anisotropic Layer Coating Liquid (Composition a)

| | |
|---|---|
| Rod-like liquid crystal compound 1 above | 70 parts by mass |
| Rod-like liquid crystal compound 2 | 30 parts by mass |
| Photopolymerization initiator (Irgacure 907, manufactured by Ciba Specialty Chemicals, Inc.) | 3.0 parts by mass |
| Sensitizer (Kayacure DETX, manufactured by Nippon Kayaku Co., Ltd.) | 1.0 part by mass |
| Fluorine compound FP-2 above | 0.21 parts by mass |
| Methyl ethyl ketone | 200 parts by mass |

Comparative Example 1

An optical laminate was prepared in the same manner as in Example 2 except that in the composition b, the fluorine compound FP-2 was not formulated.

Comparative Example 2

An optical laminate was prepared in the same manner as in Comparative Example 1 except that in the composition a, the fluorine compound FP-3 was not formulated.

Comparative Example 3

An optical laminate was prepared in the same manner as in Comparative Example 1 except that in the composition b, the fluorine compound FP-1 was not formulated.

Comparative Example 4

An optical laminate was prepared in the same manner as in Comparative Example 1 except that in the composition a, instead of using the fluorine compound FP-3, the following fluorine compound FP-5 was used.

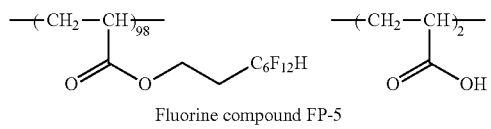

Fluorine compound FP-5

Comparative Example 5

An optical laminate was prepared in the same manner as in Comparative Example 1 except that in the composition b, the fluorine compound FP-2 was further incorporated in the amount of addition shown in Table 1.

Comparative Example 6

An optical laminate was prepared in the same manner as in Comparative Example 5 except that in the composition a, instead of using the fluorine compound FP-3, the fluorine compound FP-2 was used and in the composition b, the fluorine compound FP-2 was incorporated in the amount of addition shown in Table 1 below.

Comparative Example 7

An optical laminate was prepared in the same manner as in Comparative Example 5 except that in the composition a, instead of using the fluorine compound FP-3, the fluorine compound FP-1 was used and in the composition b, the fluorine compound FP-2 was incorporated in the amount of addition shown in Table 1 below.

<Surface Tension Energy>

The surface tensions $E_a$ and $E_b$ of the compositions a and the compositions b used in Examples and Comparative Examples, defined by the above Equations (1) and (2), were measured by the aforementioned method and differences between these values of the respective surface tensions were shown in Table 1 below.

When the surface tensions $E_A$ and $E_B$ defined by the above Equations (3) and (4) were measured from the optical laminates prepared in Examples and Comparative Examples by the aforementioned method, it could be confirmed that these values were the same as the values of the respective surface tensions $E_a$ and $E_b$.

<Film Thickness Unevenness>

(1) Unmounted State

The prepared optical laminate was placed on a schaukasten to visually confirm film thickness unevenness.

(2) Mounted State

A polarizing plate having a polarizer having a thickness of 20 μm and having one surface protected with triacetyl cellulose (thickness of 25 μm) was used and the surface of the polarizing plate which was not protected (a polarizing film formed of stretched polyvinyl alcohol) and the surface of the prepared optical laminate on the side close to the transparent support were laminated with an optically isotropic adhesive to prepare a circularly polarizing plate.

Next, an organic EL panel mounted GALAXY S4 (manufactured by SAMSUNG Electronics Co., Ltd.) was disassembled and a circularly polarizing plate was peeled off. Then, each of the circularly polarizing plates was laminated on the device while preventing air from entering therebetween, thereby preparing a display device. The prepared organic EL display devices were evaluated in terms of film thickness unevenness in a bright room having an illuminance of 200 lux.

(3) Evaluation Standards

The film thickness unevenness was evaluated based on the following standards. The results are shown in Table 1 below.

A: Unevenness was not visibly recognized both on the schaukasten and in the mounted state.

B: Slight unevenness was visibly recognized on the schaukasten but not visibly recognized in the mounted state.

C: Unevenness was visibly recognized both on the schaukasten and in the mounted state.

<Point Defect>

The prepared optical laminate was placed between two polarizing plates arranged in a cross-nicol alignment and a partial area (10 cm×10 cm) was visually confirmed on a schaukasten to count the number of point defects. The results are shown in Table 1 below.

TABLE 1

|  | Composition a | | | | Composition b | | |
|---|---|---|---|---|---|---|---|
|  |  | Fluorine compound | | |  | Fluorine compound | |
|  | Liquid crystal compound | Type | Amount of addition [% by mass] | Surface tension $E_a$ [mN/m] | Liquid crystal compound | Type | Amount of addition [% by mass] |
| Comparative Example 1 | DLC | FP-3 | 0.19 | 24.7 | CLC | FP-1 | 0.91 |
| Comparative Example 2 | DLC | — | — | 30.0 | CLC | FP-1 | 0.91 |
| Comparative Example 3 | DLC | FP-3 | 0.19 | 24.7 | CLC | — | — |
| Comparative Example 4 | DLC | FP-5 | 0.19 | 26.2 | CLC | FP-1 | 0.91 |
| Comparative Example 5 | DLC | FP-3 | 0.19 | 24.7 | CLC | FP-1 | 0.90 |
| Comparative Example 6 | DLC | FP-2 | 0.19 | 23.4 | CLC | FP-1 | 0.90 |
| Comparative Example 7 | DLC | FP-1 | 0.19 | 25.2 | CLC | FP-1 | 0.91 |
| Example 1 | DLC | FP-1 | 0.19 | 25.2 | CLC | FP-1 | 0.90 |
| Example 2 | DLC | FP-3 | 0.19 | 24.7 | CLC | FP-1 | 0.90 |

TABLE 1-continued

| | | | | | | | |
|---|---|---|---|---|---|---|---|
| Example 3 | DLC | FP-3 | 0.19 | 24.7 | CLC | FP-1 | 0.90 |
| Example 4 | DLC | FP-3 | 0.19 | 24.7 | CLC | FP-1 | 0.90 |
| Example 5 | DLC | FP-2 | 0.19 | 23.4 | CLC | FP-4 | 0.46 |
| Example 6 | DLC | FP-2 | 0.19 | 23.4 | CLC | FP-4 | 0.91 |
| Example 7 | CLC | FP-3 | 0.19 | 24.7 | CLC | FP-1 | 0.90 |
| Example 8 | CLC | FP-2 | 0.19 | 23.4 | CLC | FP-4 | 0.46 |

| | Composition b | | | | |
|---|---|---|---|---|---|
| | Fluorine compound | | | | |
| | Type | Amount of addition [% by mass] | Surface tension $E_b$ [mN/m] | Difference between surface tensions $(E_a - E_b)$ [mN/m] | Film thickness unevenness | Point defect [pieces/100 m²] |
| Comparative Example 1 | — | — | 24.5 | 0.2 | A | 7 |
| Comparative Example 2 | — | — | 24.5 | 5.5 | C | 0 |
| Comparative Example 3 | — | — | 30.0 | −5.3 | A | 13 |
| Comparative Example 4 | — | — | 24.5 | 1.7 | C | 2 |
| Comparative Example 5 | FP-2 | 0.45 | 23.8 | 0.9 | A | 4 |
| Comparative Example 6 | FP-2 | 0.90 | 23.1 | 0.3 | A | 5 |
| Comparative Example 7 | FP-2 | 0.23 | 24.3 | 1.0 | B | 4 |
| Example 1 | FP-2 | 0.45 | 23.8 | 1.4 | B | 0 |
| Example 2 | FP-2 | 0.72 | 23.4 | 1.3 | A | 0 |
| Example 3 | FP-2 | 0.81 | 23.2 | 1.5 | A | 0 |
| Example 4 | FP-2 | 0.90 | 23.1 | 1.6 | A | 0 |
| Example 5 | — | — | 20.5 | 2.9 | A | 0 |
| Example 6 | — | — | 20.4 | 3.0 | A | 0 |
| Example 7 | FP-2 | 0.72 | 23.4 | 1.3 | A | 0 |
| Example 8 | — | — | 20.5 | 2.9 | A | 0 |

As seen from the results shown in Table 1, the optical laminates in Comparative Examples 1, 3, and 5 to 7 in which the composition a and the composition b did not satisfy the above Equation (2) were suppressed in film thickness unevenness but all of the optical laminates had point defects.

In addition, it was found that in the optical laminates in Comparative Examples 2 and 4 in which the composition a and the composition b did not satisfy the above Equation (1), the generation of point defects was reduced but film thickness unevenness could not be suppressed.

In contrast, it was found that the optical laminates in Examples 1 to 8 in which the composition a and the composition b satisfied the above Equations (1) and (2) were suppressed in film thickness unevenness and were free from point defects. It was found that among these, in the case in which the composition a satisfied the above Equation (1a), that is, in the case in which the surface tension $E_a$ was 24.7 mN/m or less, the film thickness unevenness of the optically anisotropic layer was further suppressed (Examples 2 to 8).

EXPLANATION OF REFERENCES

10: optical laminate
12: transparent support
14: optically anisotropic layer A
16: optically anisotropic layer B
20: polarizing film
22: protective film
24: functional layer
26: organic EL panel
100, 110, 120: polarizing plate
200, 210, 220: organic EL display device

What is claimed is:

1. A method of producing an optical laminate having an optically anisotropic layer A, and an optically anisotropic layer B, in which the optically anisotropic layer A and the optically anisotropic layer B are provided to be in direct contact with each other, wherein both a composition a for forming the optically anisotropic layer A and a composition b for forming the optically anisotropic layer B contain a fluorine compound, and when the optically anisotropic layer A is formed using the composition a and then the optically anisotropic layer B is formed using the composition b, the optically anisotropic layer A and the optically anisotropic layer B are formed in this order under a condition that the composition a and the composition b satisfy both the following Equations (1) and (2), $$E_a \leq 25.2 \text{ [mN/m]} \quad (1)$$

$$E_a - E_b \geq 1.3 \text{ [mN/m]} \quad (2)$$

where $E_a$ refers to a surface tension obtained by measuring a solution, which is formed by dissolving a fluorine compound included in the composition a in a mixed solvent in which methyl ethyl ketone and cyclohexanone are mixed at a mass ratio of 1:4 in an amount that is equal to the amount included in X g of a solid content in the composition a so that a total amount of the solution is X g, in an environment of a temperature of 25° C. and a relative humidity of 60%, similarly, $E_b$ refers to a surface tension obtained by measuring a solution, which is formed by dissolving a fluorine compound included in the composition b in a mixed solvent in which methyl ethyl ketone and cyclohexanone are mixed at a mass ratio of 1:4 in an amount that is equal to an amount included in X g of a solid content in the composition b so that a total amount of the solution is X g, in an environment of a temperature of 25° C. and a relative humidity of 60%.

2. The method of producing an optical laminate according to claim 1,
wherein either or both of the composition a and the composition b contain a liquid crystal compound.

3. An optical laminate comprising:
a transparent support;
an optically anisotropic layer A; and
an optically anisotropic layer B in this order,
wherein the optically anisotropic layer A and the optically anisotropic layer B are in direct contact with each other,
both the optically anisotropic layer A and the optically anisotropic layer B contain a fluorine compound, and
the optically anisotropic layer A and the optically anisotropic layer B satisfy both the following Equations (3) and (4), $$E_A \leq 25.2 \ [mN/m] \quad (3)$$

$$E_A - E_B \geq 1.3 \ [mN/m] \quad (4)$$

where $E_A$ refers to a surface tension obtained by measuring a solution, which is formed by dissolving a fluorine compound included in the optically anisotropic layer A in a mixed solvent in which methyl ethyl ketone and cyclohexanone are mixed at a mass ratio of 1:4 in an amount that is equal to an amount included in Y g of the optically anisotropic layer A so that a total amount of the solution is Y g, in an environment of a temperature of 25° C. and a relative humidity of 60%,
similarly, $E_a$ refers to a surface tension obtained by measuring a solution, which is formed by dissolving a fluorine compound included in the optically anisotropic layer B in a mixed solvent in which methyl ethyl ketone and cyclohexanone are mixed at a mass ratio of 1:4 in an amount that is equal to an amount included in Y g of the optically anisotropic layer B so that a total amount of the solution is Y g, in an environment of a temperature of 25° C. and a relative humidity of 60%.

4. A polarizing plate comprising:
the optical laminate according to claim 3; and
a polarizing film.

5. An organic EL display device comprising the optical laminate according to claim 3.

6. An organic EL display device comprising: the polarizing plate according to claim 4.

* * * * *